United States Patent
Viehmann et al.

(10) Patent No.: US 6,813,181 B1
(45) Date of Patent: Nov. 2, 2004

(54) CIRCUIT CONFIGURATION FOR A CURRENT SWITCH OF A BIT/WORD LINE OF A MRAM DEVICE

(75) Inventors: Hans Viehmann, S. Burlington, VT (US); John K. DeBrosse, Colchester, VT (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/445,550

(22) Filed: May 27, 2003

(51) Int. Cl.[7] .................................................. G11C 11/40

(52) U.S. Cl. .................. 365/158; 365/171; 365/173

(58) Field of Search ................................ 365/158, 171, 365/173

(56) References Cited

U.S. PATENT DOCUMENTS

| | | | | |
|---|---|---|---|---|
| 6,097,626 A | * | 8/2000 | Brug et al. | 365/171 |
| 6,483,768 B2 | * | 11/2002 | Bohm et al. | 365/230.06 |
| 6,487,109 B2 | * | 11/2002 | Thewes et al. | 365/158 |
| 6,501,686 B2 | * | 12/2002 | Boehm et al. | 365/189.11 |
| 6,577,528 B2 | * | 6/2003 | Gogl et al. | 365/158 |
| 6,646,910 B2 | * | 11/2003 | Bloomquist et al. | 365/158 |

* cited by examiner

*Primary Examiner*—Son Mai
(74) *Attorney, Agent, or Firm*—Moser, Patterson & Sheridan, L.L.P.

(57) ABSTRACT

A circuit configuration for a current switch of a bit line or a word line of a magnetoresistive random access memory (MRAM) device, comprising a directional switch and a voltage driver that, in operation, reduces the ON resistance of the directional switch. In one embodiment, each terminal of the line is provided with such a switch.

27 Claims, 3 Drawing Sheets

CIRCUIT CONFIGURATION FOR A CURRENT SWITCH OF A BIT/WORD LINE OF A MRAM DEVICE

BACKGROUND OF THE INVENTION

1. Field of the Invention

The present invention generally relates to memory devices. More specifically, the present invention relates to magnetoresistive random access memory (MRAM) devices.

2. Description of the Related Art

A MRAM device comprises a plurality of memory cells that store information in the form of a direction of magnetization of a ferromagnetic region. The memory cells are organized in a two-dimensional array wherein each memory cell is disposed at a crossover point between two intersecting conductive lines. Such lines are commonly referred to as bit/word lines or, individually, as a bit line and a word line. During the operation, the bit/word lines facilitate bi-directional transmission of information within the MRAM device.

The bit and word lines are used to select an individual memory cell and to enter (i.e., "write") an information content into the memory cell or evaluate (i.e., "read") the information content that has been stored in the cell. Such lines form a network that comprises "global" and "local" bit and word lines. To facilitate the writing and reading operations, the word and bit lines use controlled current sources and controlled current switches.

During a writing operation, the current sources provide pulses of a current (i.e., "write current") of pre-determined value that propagate in a specified direction along the bit and word lines. The write currents enter the information content (i.e., "0" or "1") in the selected memory cell. Such currents do not pass through the memory cells.

During a reading operation, a sensing circuit of the MRAM device determines a value of electrical resistance of a selected memory cell. The resistance of the memory cell is different based on whether the "0" or "1" has been stored in such a cell during the writing operation. The read currents may propagate through the memory cell and portions of the bit and the word lines coupled to the memory cell.

In MRAM devices having high-density arrays of the memory cells, the lengths of the bit/word lines tend to increase. Long bit/word lines have high electrical resistance and, in operation, require high-power current switches. Such current switches occupy large areas on a MRAM chip and, as such, decrease the information capacity of the chip (measured as a number of the memory cells per unit area of the chip), as well as increase the costs of fabricating the MRAM devices.

Therefore, there is a need in the art for an improved circuit configuration of a current switch for a bit line or a word line of a magnetoresistive random access memory (MRAM) device.

SUMMARY OF THE INVENTION

A circuit configuration for a bi-directional current switch of a bit line or a word line of a magnetoresistive random access memory (MRAM) device is disclosed. The current switch comprises a bi-directional switch and a voltage driver that reduces the ON resistance of the bi-directional switch. In one embodiment, the bi-directional switch comprises a line transistor (e.g., MOSFET transistor), and the voltage driver comprises a pulse generator coupled to a transistor switch that controls a gate of the line transistor. In operation, the voltage driver facilitates a high potential of a gate of the line transistor.

Another aspect of the invention is a circuit configuration for writing an information content in a memory cell of a MRAM device, comprising a bi-directional bit line or a bi-directional word line coupled to a memory cell of a plurality of such cells, two driving circuits, each driving circuit comprising the inventive bi-directional current switch and a sink transistor, and a controller controlling the driving circuits.

Yet another aspect of the invention is a circuit configuration for a unidirectional current switch of a MRAM device. In one embodiment, the current switch comprises a line transistor and a voltage driver, wherein the voltage driver comprises a pulse generator coupled to a transistor switch controlling a gate of the line transistor. In operation, the voltage driver facilitates a high potential of a gate of the line transistor.

Still another aspect of the invention is a circuit configuration for writing an information content in a memory cell of a MRAM device, comprising a unidirectional bit line or a unidirectional word line coupled to a memory cell of a plurality of such cells, a driving circuit comprising the inventive unidirectional current switch and a sink transistor, and a controller controlling the driving circuit.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

It is to be noted, however, that the appended drawings illustrate only exemplary embodiments of this invention and are therefore not to be considered limiting of its scope, for the invention may admit to other equally effective embodiments.

DETAILED DESCRIPTION

The present invention is a circuit configuration for a current switch o f a word line or a bit line of a magnetoresistive random access memory (MRAM) device. The current switch has low ON resistance (i.e., resistance in a conductive, or closed, state), as well as low power dissipation. Such current switch may be fabricated on a substrate, such as a semiconductor wafer, using circuit elements (e.g., field effect transistors) having a small footprint.

Figure 1:
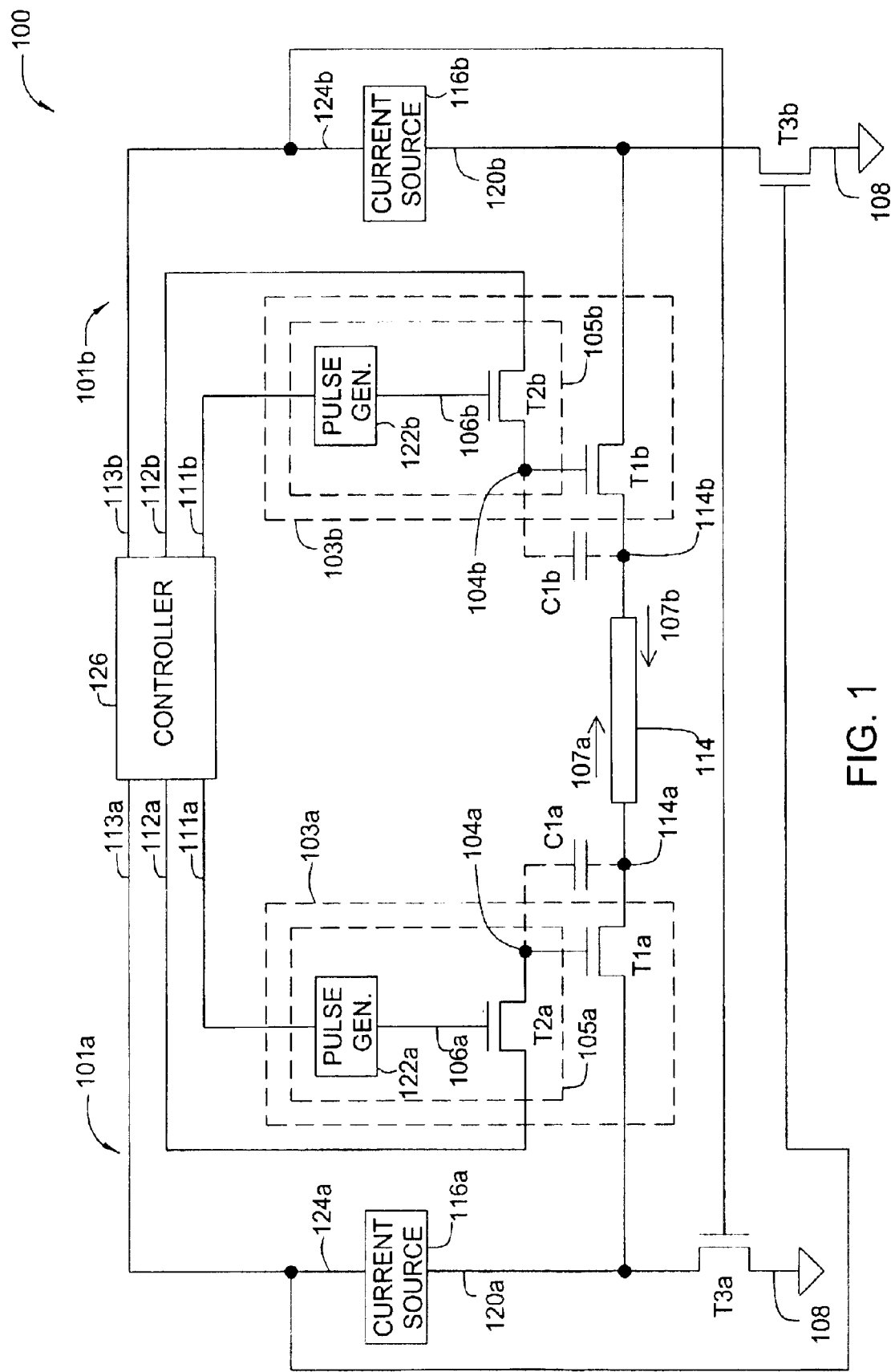
FIG. 1 depicts an exemplary circuit configuration of a bit or word line having current switches in accordance with one embodiment of the present invention.

FIG. 1 depicts an exemplary circuit configuration of a local bit/word line (i.e., a word line or a bit line) 100 having current switches 103a and 103b in accordance with one embodiment of the present invention.

The local bit/word line 100 is generally a bi-directional line comprising a line conductor 114 and symmetrically structured driving circuits 101a and 101b. A MRAM device typically comprises a plurality of such local lines that may further be coupled a global bit line or a global word line of the MRAM device.

Propagation of electrical signals (e.g., write currents) through the local bit/word line 100, as well as operation and synchronization of the circuit elements of such a line, is generally administered by a programmable control circuit, such as controller 126. The controller 126 may be associated with either the MRAM device or an external processor. The output terminals of the controller 126 used to administer an operation of the local bit/word line 100 are designated herein as 111a–113a (driving circuit 101a) and 111b–113b (driving circuit 101b), respectively. Generally, such outputs are high-rate pulsed outputs.

The driving circuits 101a and 101b have the same structure. In operation, such a structure of the driving circuits 101a and 101b facilitates bi-directionality of the local bit/word line 100. In FIG. 1, same numerical identifiers that are differentiated only by the alphabetical extensions "a" and "b" are assigned to the corresponding terminals of the line conductor 114, circuit elements of the driving circuits 101a and 101b, and controller 126, respectively.

Operation of the local bit/word line 110 is arbitrarily described below in reference to the driving circuit 101a that facilitates propagation of a line current $I_L$ through the line conductor 114 in the direction illustrated by arrow 107a. The driving circuit 101b operates similar to the driving circuit 101a and facilitates propagation of the line current $I_L$ through the line conductor 114 in the direction illustrated by arrow 107b.

In the depicted embodiment, the transistors used in the local bit/word line 100 are generally metal-oxide-semiconductor (MOSFET) field effect transistors, and the like. In the ON state, resistance of the MOSFET transistor is generally inversely proportional to a gate to source voltage of the transistor. Typically, for example, a 10% increase in the gate voltage reduces such a resistance by approximately 10%.

The line conductor 114 comprises terminals (or nodes) 114a and 114b coupled to the driving circuits 101a and 101b, respectively. Generally, the line conductor 114 is a film conductor formed of copper (Cu), aluminum (Al), or other conductive material. In the MRAM device, the line conductor 114 is further electrically coupled to the electrodes (e.g., top electrodes or, alternatively, bottom electrodes) of a plurality of MRAM cells (not shown) of such a device.

The line conductor 114 has an electrical resistance R. In operation when line conductor 114 transmits the line current $I_L$, a voltage drop $V_{114}=I_L R$ is developed between the terminals 114a, 114b of the line conductor.

The driving circuit 101a generally comprises a current source 116a, a current switch 103a, and a sink transistor T3a.

The current source 116a generally is a current source providing a line current $I_L$ (e.g., a write current) to the local bit/word line 100. The current source 116a is controlled using the controller 126 via the output 113a (e.g., data output of the driving circuit 101a). From the output of the current source 116a, the line current $I_L$ may propagate through the current switch 103a, line conductor 114, current switch 103b, and sink transistor T3b to a common ground 108, as illustrated using the arrow 107a. Correspondingly, from an output 120b of the current source 116b, the line current $I_L$ may propagate through the current switch 103b, line conductor 114, current switch 103a, and sink transistor T3a to the common ground 108 (illustrated using arrow 107b).

The current switch 103a is a bi-directional current switch. In one embodiment, the current switch 103a comprises a line transistor T1a (e.g., MOSFET transistor, and the like) and voltage driver 105a. One input/output of the line transistor T1a is coupled to the terminal 114a of the line conductor 114, while the other input/output of the line transistor T1a is coupled to the output 120a of the current source 116a and an input of the sink transistor T3a. The gate of the line transistor T1a is coupled to the output 104a of the voltage driver 105a.

The voltage driver 105a comprises a pulse generator 122a and a transistor switch T2a. The pulse generator 122a is an electronic device (e.g., a voltage multiplier, charge pump, and the like) that is capable of producing a combination of a pulsed and steady state output. The controller 126 generally controls the pulse generator 122a using the output terminal 111a (e.g., syncro output).

An output of the voltage driver 105a is coupled to a control input 106a (i.e., gate) of a transistor switch T2a. The transistor switch T2a is generally a small MOSFET transistor. An input of the transistor switch T2a is coupled to the output terminal 112a (e.g., decoder output of the driving circuit 101a) of the controller 126, while the output of the transistor switch T2a is coupled to a gate of the line transistor T1a.

The output of the sink transistor T3a is coupled to the common ground 108 of the local bit/word line 100, while a gate of the sink transistor T3a and a control input 124b of the current source 116b are coupled to the output terminal 113b of the controller 126. Correspondingly, an output of the sink transistor T3b is coupled to the common ground 108, and a gate of the sink transistor T3b and a control input 124a of the current source 116a are coupled to the output terminal 113a of the controller 126.

Operation of the inventive current switch is described below in reference to the current switch 103a and driving circuit 101a (i.e., when the controller 126 administers the line current $I_L$ to propagate in the direction illustrated by the arrow 7a). The current switch 103b and driving circuit 101b operate similarly to that when the controller 126 administers the line current $I_L$ to propagate in the direction illustrated by the arrow 7b.

Figure 2:
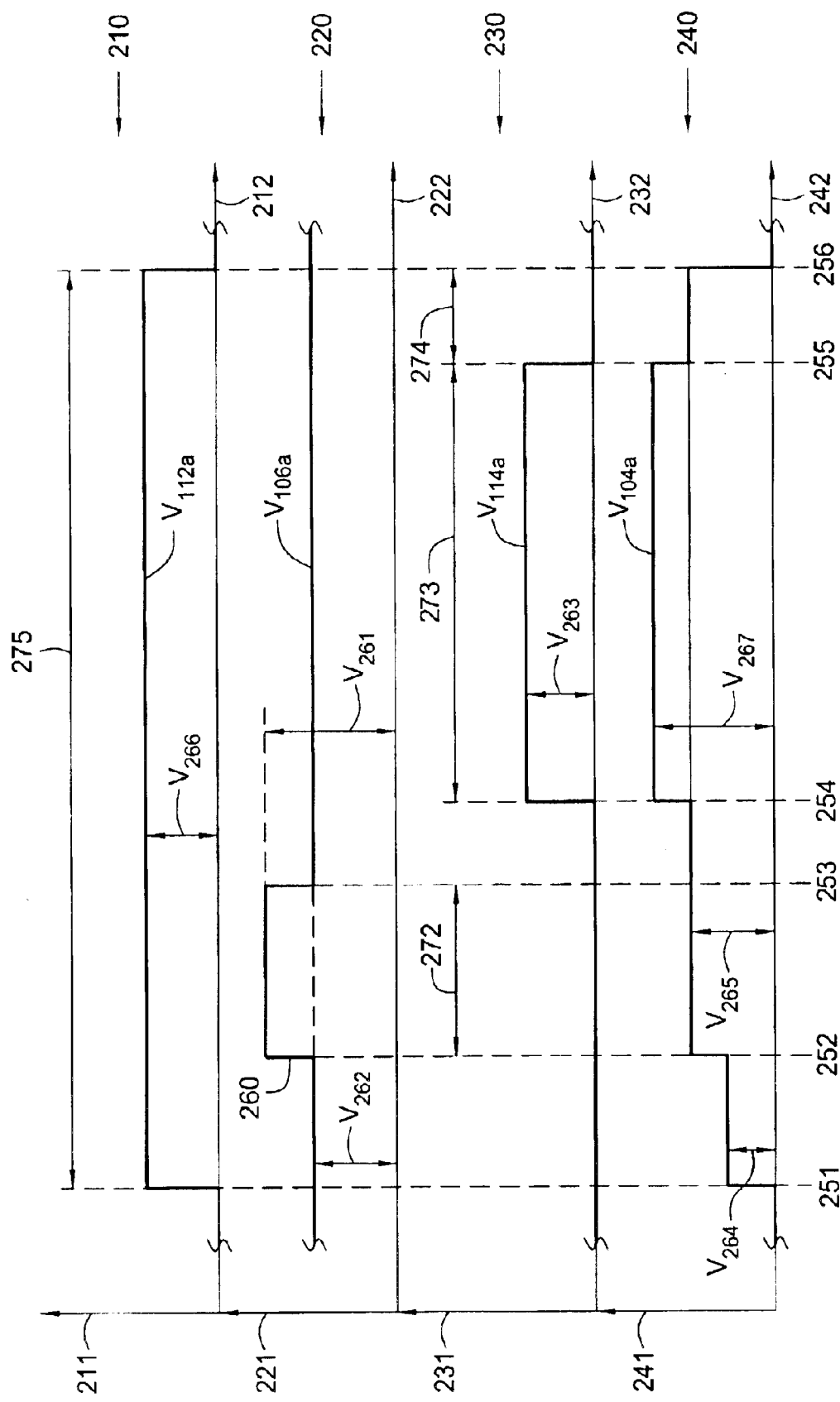
FIG. 2 depicts an illustrative timing diagram of the bit or word line of FIG. 1.

FIG. 2 depicts an illustrative timing diagram of signals controlling operation of the current switch 103a of FIG. 1. The graphs in the FIG. 2 are not depicted to scale and are conventionally simplified.

A first graph 210 depicts voltage $V_{112a}$ (y-axis 211) at the decoder output 112a versus time (axis 212). A second graph 220 depicts voltage $V_{106}a$ (y-axis 221) at the output of the pulse generator 122a versus time (axis 222). A third graph 230 depicts voltage $V_{114a}$ (y-axis 231) at the terminal 114a of the line conductor 114 versus time (axis 232). A fourth graph 240 depicts voltage $V_{104a}$ (y-axis 241) at the gate of the line transistor T1a versus time (axis 242). The graphs of the respective signals in the FIG. 2 are depicted for a cycle (time interval) 275 that begins at a moment 251 and ends at a moment 256. In operation, the time interval 275 corresponds to the time interval that is selected by the controller 126 for transmitting the line current $I_L$ of the local bit/word line 100 in the direction of the arrow 107a.

The decoder output 112a becomes active at the moment 251 and stays active during the time interval 275. In the active state, the voltage $V_{112a}$ generally has an amplitude $V_{266}$ that is approximately equal to the supply voltage of the MRAM device, i.e., about 1.5 to 2 V. Such supply voltage is substantially greater than a threshold voltage of any transistor of the local bit/word line 100, including the line transistor T1a and transistor switch T2a. Additionally, during the time interval 275, the controller 126 initiates the current source 116a, as well as sets the line transistor T1b and sink transistor T3b to a conductive state (i.e., ON state) to complete a conductive path for the line current $I_L$.

Prior to the moment 252 and after the moment 253, the output voltage $V_{106a}$ of the pulse generator 122a has an amplitude $V_{262}$ that is greater than a threshold voltage of the transistor switch T2a. Generally the amplitude $V_{262}$ is approximately equal to the supply voltage of the MRAM device.

An ON resistance of a MOSFET transistor is generally inversely proportional to a gate to source voltage (or potential) of the transistor. In the case of the line transistor T1a, such a voltage is reduced by a voltage drop across a current path for the line current $I_L$ comprising the line conductor 114, line transistor T1b, and sink transistor T3b. More specifically, the voltage drop is applied to the terminal 114a of the line conductor 114 and, as such, reduces the voltage between the source and the gate of the line transistor T1a. In the current switch 103a, to reduce the ON resistance of the line transistor T1a, the gate of the line transistor T1a is maintained at potential $V_{267}$ that is greater than the voltage $V_{262}$ (discussed in reference to graph 240).

When applied to the gate of the switch transistor T2a, the output voltage $V_{106a}$ sets the switch transistor T2a to a first ON state. In the first ON state, the switch transistor T2a maintains the gate of the line transistor T1a at the voltage $V_{264}$ that is smaller than the voltage $V_{112a}$ by a value of the voltage drop $V_{T2a}$ across the switch transistor T2a in the first ON state. When applied to the gate of the line transistor T1a, the voltage $V_{264}$ sets the line transistor T1a a to a first conducting state when the transistor T1a possesses a first ON resistance $R_{ON1}$.

At a moment 252, a signal from the output terminal 111a of the controller 126 initiates the pulse generator 122a to produce a pulse 260 having an amplitude $V_{261}$ and a duration 272. The amplitude $V_{261}$ exceeds the steady state output voltage $V_{262}$ of the pulse generator 122a by at least a value of the threshold voltage (i.e., about 0.40–0.5V) of the line transistor T1a. Generally, the amplitude $V_{261}$ is greater than the voltage $V_{262}$ by about 1V. As such, the amplitude $V_{261}$ of the pulse 260 may exceed the supply voltage of the MRAM device.

When applied to the gate of the switch transistor T2a, the pulse 260 sets the switch transistor T2a to a second ON state. In the second ON state, the high amplitude of the pulse 260 reduces the voltage drop $V_{T2\_a}$ across the switch transistor T2a and, as such, increases the gate voltage $V_{104a}$ of the line transistor T1a to about the voltage $V_{265}$ that is approximately equal to the supply voltage of the MRAM device.

Such a high gate voltage $V_{104a}$ (i.e., voltage $V_{265}$) sets the line transistor T1a to a second conducting state when the line transistor T1a possesses a second ON resistance $R_{ON2}$ that is smaller than the first ON resistance $R_{ON1}$. More specifically, an increase of the gate voltage $V_{104a}$ by 1V from about 1.5V (voltage $V_{264}$) to about 2.5V (voltage $V_{265}$) may reduce the ON resistance of the line transistor T1a by approximately 50%.

At a moment 253, the output voltage $V_{106a}$ of the pulse generator 122a and, correspondingly, the gate voltage of the switch transistor T2a, decrease to the steady state voltage $V_{262}$, thereby setting the transistor switch T2a to the OFF (i.e., non-conducting) state. Beginning from the moment 253, the gate of the line transistor T1a is floating (i.e., electrically isolated) at the voltage (or potential) $V_{265}$.

During a time interval 273 that starts at a moment 254 and ends at the moment 255, the current source 116a produces the line current $I_L$ propagating through the line transistor T1a, line conductor 114, line transistor T1b, and sink transistor T3b to the common ground 108. The parasitic capacitor C1a is the channel to gate capacitance of the transistor T1a. Generally, a capacitance of the parasitic capacitor C1a increases with length and width of the line transistor T1a.

At a moment 254, when the line current $I_L$ flows through the line conductor 114, a voltage at the node 114a increases to a voltage $V_{263}$ that is equal to a sum of the voltage drop $V_{114}=I_L R$ across the line conductor 114 and the voltage drop across the line transistor T1b and sink transistor T3b. Via the parasitic capacitor C1a, the increase of the voltage $V_{114a}$ at the node 114a (i.e., voltage $V_{263}$) charges the floating gate of the line transistor T1a to a potential $V_{267}$ that is greater than the potential $V_{265}$.

When the gate of the line transistor T1a is floating at the high potential $V_{267}$, the line transistor T1a possesses a third ON resistance $R_{ON3}$. The third ON resistance $R_{ON3}$ is smaller than the second ON resistance $R_{ON2}$. As such, a small (i.e., occupying small area of the MRAM chip) line transistor T1a may be used to conduct the line current $I_L$ in the local bit/word line 100.

In one exemplary embodiment, during transmitting the line current $I_L$, resistance of the line transistor of the current switch 103a (i.e., third ON resistance $R_{ON3}$ of the line transistor T1a) was approximately 50% less than the resistance of the current switch 303a of the prior art having a line transistor T4a (discussed in reference to FIG. 3 below). As such, the line transistor T1a could be formed on the smaller area of the substrate. More specifically, in this embodiment, the area occupied by the line transistor T1a was approximately 50% smaller than the area occupied by the line transistor T4a.

Additionally, a capacitive coupling facilitated through the parasitic capacitance C1a provides self-regulating feedback to the line transistor T1a as the line current $I_L$ changes. The potential $V_{267}$ at the gate of the line transistor T1a is proportional to the line current $I_L$. As such, the ON resistance $R_{ON3}$ decreases when the line current $I_L$ increases, as well as the resistance $R_{ON3}$ increases when the line current $I_L$ decreases, respectively. Correlation between the line current $I_L$ and the ON resistance $R_{ON3}$ of the line transistor T1a stabilizes loading conditions of the current source 116a and simplifies design of the current source.

At the moment 255, the current source 116a terminates the line current $I_L$ causing the potential of the floating gate of the line transistor T1a to decrease to the preceding value $V_{265}$. At the moment 256, the decoder output 112a becomes inactive (i.e., $V_{112a}=0$) resulting in a decrease in the potential of the floating gate of the line transistor T1a to 0 and setting the line transistor T1a to the OFF state. At the moment 256, the time interval 275 ends.

Figure 3:
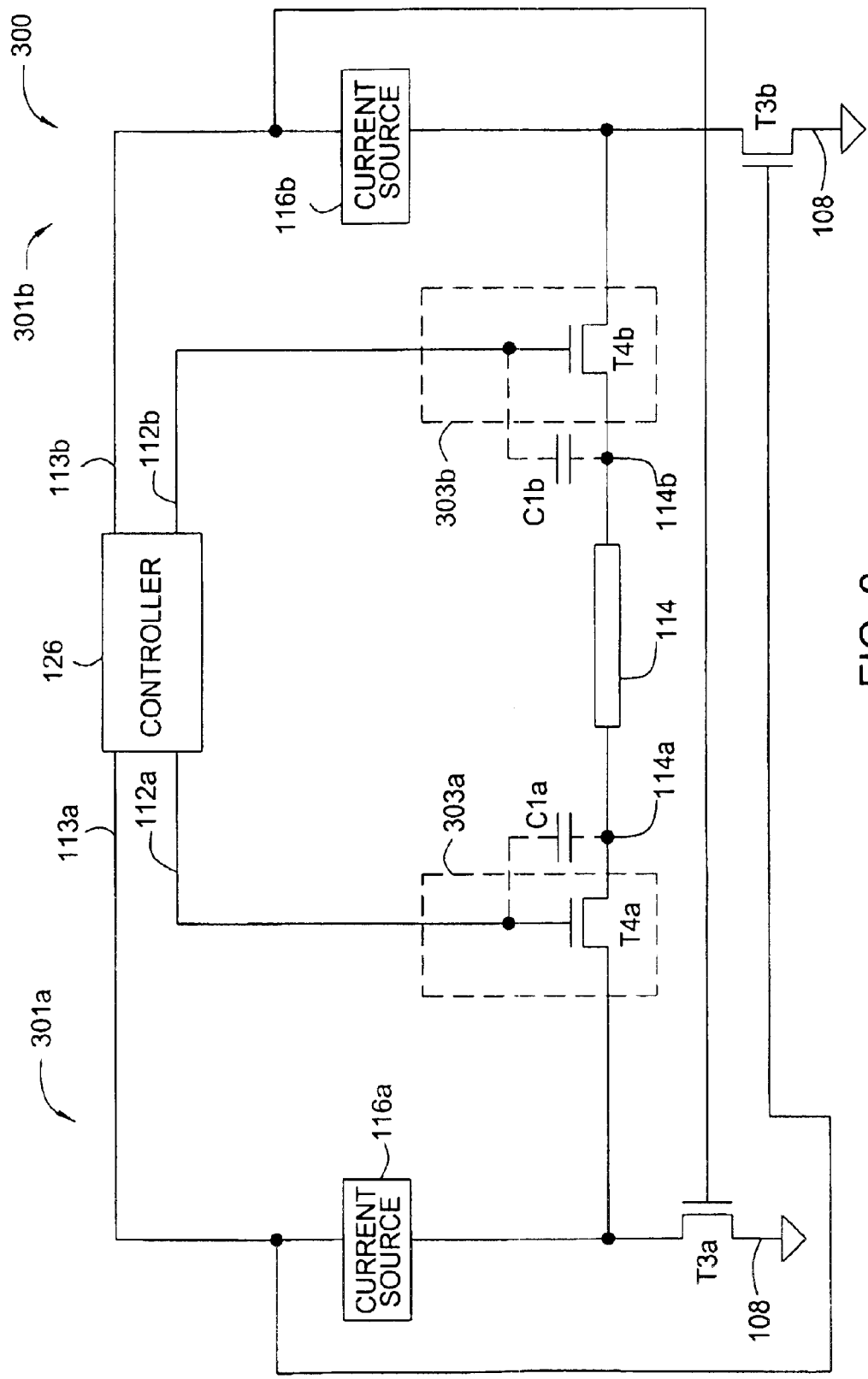
FIG. 3 depicts an exemplary circuit configuration of a bit or word line having current switches known in the prior art.

For purpose of comparison and further illustration of advantages of the present invention, an exemplary circuit configuration of a bit/word line 300 of a prior art is depicted in FIG. 3. The bit/word line 300 comprises a driving circuit 301a having a current switch 303a, and a driving circuit 301b having a current switch 303b, respectively. The current switches 303a and 303b are generally large MOSFET transistors T4a and T4b, respectively.

During the time interval 275, a gate of the line transistor T4a is maintained at the output voltage of the terminal 112a of the controller 126. Such a voltage is approximately equal to the supply voltage of the MRAM device. In operation when the line current $I_L$ flows through the line conductor 114, the voltage at the node 114a increases. However, in the current switch 303a, such increase of the voltage at the node 114a does not cause increase of a gate voltage of the line transistor T4a because the gate is coupled to the decoder output 112a and cannot float to a potential higher than the supply voltage. As such, the line transistor T4a possesses a high ON resistance. In contrast with the line transistor T1a (discussed in reference to FIG. 1), the line transistor T4a is a large transistor occupying a considerable area of the MRAM chip.

The invention may be practiced using other circuit elements wherein the circuit parameters may be adjusted to achieve acceptable characteristics by those skilled in the arts by utilizing the teachings disclosed herein without departing from the spirit of the invention.

Although the forgoing discussion referred to the circuit configuration for a bi-directional current switch, circuit configuration for the unidirectional current switch of a word line or a bit line of a MRAM device, as well as circuit configurations for the other microelectronic and electronic devices can benefit from the invention.

While the foregoing is directed to the illustrative embodiment of the present invention, other and further embodiments of the invention may be devised without departing from the basic scope thereof, and the scope thereof is determined by the claims that follow.

What is claimed is:

1. A circuit configuration for a current switch of a line, selected from one of a bit line and a word line, of a magnetoresistive random access memory (MRAM) device, comprising:
    a bi-directional switch having a first input/output coupled to a first end of said line and a second input/output coupled to a current source, and a control input; and
    a voltage driver maintaining said control input at a high voltage to decrease the ON resistance of the bi-directional switch.

2. The circuit configuration of claim 1 wherein the voltage driver comprises a pulse generator coupled to a control input of a transistor switch, said transistor switch having an input coupled to a controller of the MRAM device and an output coupled to the control input of the bi-directional switch.

3. The circuit configuration of claim 2 wherein the bi-directional switch and the transistor switch are field effect transistor switches.

4. The circuit configuration of claim 2 wherein the pulse generator produces a pulsed output voltage and a steady state output voltage that are greater than a threshold voltage of the transistor switch.

5. The circuit configuration of claim 4 wherein the pulsed output voltage increases a gate voltage of the bi-directional switch by at least a threshold voltage of the bi-directional switch.

6. The circuit configuration of claim 2 wherein a duration of a pulse of the pulse generator expires before said line is selected to transmit an electrical current.

7. A circuit configuration for writing an information content in a memory cell of a MRAM device, comprising:
    (a) line, selected from one of a bit line and a word line, coupled to the memory cell of a plurality of such cells;
    (b) a first driving circuit, comprising:
        a first bi-directional switch having a first input/output coupled to a first end of said line and a second input/output coupled to a first current source, and a control input;
        a first voltage driver coupled to the control input of the first bi-directional switch; and
        a first sink transistor having an input coupled to a second input/output of the first bi-directional switch and an output coupled to a ground terminal of the line;
    (c) a second driving circuit, comprising:
        a second bi-directional switch having a first input/output coupled to a second end of said line and a second input/output coupled to a second current source, and a control input;
        a second voltage driver coupled to the control input of the second bi-directional switch; and
        a second sink transistor having an input coupled to a second input/output of the second bi-directional switch and an output coupled to the ground terminal of the line; and
    (d) a controller controlling the first driving circuit and the second driving circuit.

8. The circuit configuration of claim 7 wherein each of said voltage drivers comprises a pulse generator coupled to a control input of a transistor switch, said switch having an input coupled to the controller and an output coupled to the control input of the first bi-directional switch.

9. The circuit configuration of claim 8 wherein the bi-directional switch and the transistor switch are field effect transistor switches.

10. The circuit configuration of claim 8 wherein the pulse generator produces a pulsed output voltage and a steady state output voltage that are greater than a threshold voltage of the transistor switch.

11. The circuit configuration of claim 10 wherein the pulsed output voltage increases a gate voltage of the bi-directional switch by at least a threshold voltage of the bi-directional switch.

12. The circuit configuration of claim 8 wherein a duration of a pulse of the pulse generator expires before said line is selected to transmit an electrical current.

13. The circuit configuration of claim 7 wherein the first current source is enabled and first sink transistor is set ON while the second current source is disabled and the second sink transistor is set OFF when said line transmits an electrical current from the first end to the second end of the line.

14. The circuit configuration of claim 7 wherein the first current source is disabled and first sink transistor is set OFF while the second current source is enabled and the second sink transistor is set ON when said line transmits an electrical current from the second end to the first end of the line.

15. A circuit configuration for a current switch of a line, selected from one of a bit line and a word line, of a magnetoresistive random access memory (MRAM) device, comprising:
    an unidirectional switch having an output coupled to a first end of said line and an input coupled to a current source, and a control input; and
    a voltage driver maintaining said control input at a high voltage to decrease the ON resistance of the unidirectional switch.

16. The circuit configuration of claim 15 wherein the voltage driver comprises a pulse generator coupled to a control input of a transistor switch, said transistor switch having an input coupled to a controller of the MRAM device and an output coupled to the control input of the unidirectional switch.

17. The circuit configuration of claim 16 wherein the transistor switch is field effect transistor switch.

18. The circuit configuration of claim 16 wherein the pulse generator produces a pulsed output voltage and a steady state output voltage that are greater than a threshold voltage of the transistor switch.

19. The circuit configuration of claim 18 wherein the pulsed output voltage increases a gate voltage of the unidirectional switch by at least a threshold voltage of the unidirectional switch.

20. The circuit configuration of claim 16 wherein a duration of a pulse of the pulse generator expires before said line is selected to transmit an electrical current.

21. A circuit configuration for writing an information content in a memory cell of a MRAM device, comprising:
  (a) line, selected from one of a bit line and a word line, coupled to the memory cell of a plurality of such cells;
  (b) a driving circuit, comprising:
    a unidirectional switch having an output coupled to a first end of said line and an output coupled to a current source, and a control input;
    a voltage driver coupled to the control input of the unidirectional switch; and
    a sink transistor having an input coupled to a second end of said line and an output coupled to a ground terminal of the line; and
  (c) a controller controlling the driving circuit.

22. The circuit configuration of claim 21 wherein the voltage driver comprises a pulse generator coupled to a control input of a transistor switch, said switch having an input coupled to the controller and an output coupled to the control input of the unidirectional switch.

23. The circuit configuration of claim 22 wherein the transistor switch is field effect transistor switch.

24. The circuit configuration of claim 22 wherein the pulse generator produces a pulsed output voltage and a steady state output voltage that are greater than a threshold voltage of the transistor switch.

25. The circuit configuration of claim 24 wherein the pulsed output voltage increases a gate voltage of the unidirectional switch by at least a threshold voltage of the unidirectional switch.

26. The circuit configuration of claim 22 wherein a duration of a pulse of the pulse generator expires before said line is selected to transmit an electrical current.

27. The circuit configuration of claim 21 wherein the current source is enabled and the sink transistor is set ON when said line transmits an electrical current.

* * * * *